United States Patent
Liu et al.

(10) Patent No.: US 10,003,087 B1
(45) Date of Patent: Jun. 19, 2018

(54) STRETCHABLE PRINTED BATTERY AND METHODS OF MAKING

(71) Applicant: Flextronics AP, LLC, Broomfield, CO (US)

(72) Inventors: Weifeng Liu, Dublin, CA (US); Dick Tak Shing Pang, Tsuen Wan (HK); Anwar Mohammed, San Jose, CA (US); Murad Kurwa, San Jose, CA (US)

(73) Assignee: Flextronics AP, LLC, Broomfield, CO (US)

( * ) Notice: Subject to any disclaimer, the term of this patent is extended or adjusted under 35 U.S.C. 154(b) by 283 days.

(21) Appl. No.: 14/563,885

(22) Filed: Dec. 8, 2014

Related U.S. Application Data

(60) Provisional application No. 61/913,830, filed on Dec. 9, 2013.

(51) Int. Cl.
| | | |
|---|---|---|
| *H01M 6/10* | (2006.01) | |
| *H01M 6/40* | (2006.01) | |
| *H01M 10/04* | (2006.01) | |
| *H01M 6/12* | (2006.01) | |
| *H01M 2/08* | (2006.01) | |

(52) U.S. Cl.
CPC .............. *H01M 6/40* (2013.01); *H01M 2/08* (2013.01); *H01M 6/12* (2013.01); *H01M 10/0436* (2013.01)

(58) Field of Classification Search
None
See application file for complete search history.

(56) References Cited

U.S. PATENT DOCUMENTS

| | | | |
|---|---|---|---|
| 3,471,348 A | 10/1969 | Iles | |
| 4,733,383 A | 3/1988 | Waterbury | |
| 4,956,524 A | 9/1990 | Karkow | |
| 5,184,827 A | 2/1993 | Suttle | |
| 5,259,833 A | 11/1993 | Barnett | |
| 5,326,652 A * | 7/1994 | Lake .................... | G01S 13/767 |
| | | | 429/127 |
| 5,555,915 A | 9/1996 | Kanao | |
| 5,777,275 A | 7/1998 | Mizutani | |
| 5,778,941 A | 7/1998 | Inada | |
| 5,816,848 A | 10/1998 | Zimmerman | |
| 5,890,587 A | 4/1999 | Roegner | |
| 6,103,971 A | 8/2000 | Sato et al. | |
| 6,160,254 A | 12/2000 | Zimmerman | |
| 6,172,344 B1 | 1/2001 | Gordon et al. | |
| 6,192,940 B1 | 2/2001 | Koma et al. | |
| 6,307,751 B1 | 10/2001 | Bodony | |
| 6,339,193 B1 | 1/2002 | Goett et al. | |
| 6,349,201 B1 | 2/2002 | Ford | |
| 6,711,024 B1 | 3/2004 | Johansson | |
| 6,714,431 B2 | 3/2004 | Gamini et al. | |
| 6,743,982 B2 | 6/2004 | Biegelsen et al. | |

(Continued)

*Primary Examiner* — Scott J Chmielecki
(74) *Attorney, Agent, or Firm* — Haverstock & Owens LLP

(57) ABSTRACT

A stretchable battery and the method of manufacturing the same. The stretchable battery can be manufactured by using a printing process. The construction of the stretchable battery can comprise a first layer of an elastomer film, a first current collector layer, a layer of cathode, a separating layer, a layer of anode, and a second current collector layer. Metal traces can be used to couple with the first and/or the second current collector layers.

20 Claims, 5 Drawing Sheets

(56) References Cited

U.S. PATENT DOCUMENTS

| | | |
|---|---|---|
| 6,797,881 B2 | 9/2004 | Nakamura |
| 7,156,127 B2 | 1/2007 | Moulton et al. |
| 7,191,803 B2 | 3/2007 | Orr et al. |
| 7,234,831 B1 | 6/2007 | Hanley |
| 7,319,895 B2 | 1/2008 | Klefstad-Sillonville |
| 7,491,892 B2 | 2/2009 | Biegelson et al. |
| 7,494,238 B2 | 2/2009 | Genz |
| 7,573,727 B2 | 8/2009 | Hauenstein |
| 7,629,691 B2 | 12/2009 | Roush et al. |
| 7,641,488 B2 | 1/2010 | Ho |
| 7,735,523 B2 | 6/2010 | Smith et al. |
| 7,795,540 B2 | 9/2010 | Yamada et al. |
| 8,157,730 B2 | 4/2012 | LeBoeuf |
| 8,207,473 B2 | 6/2012 | Axisa et al. |
| 8,258,011 B2 | 9/2012 | Brun |
| 8,283,602 B2 | 10/2012 | Augustine et al. |
| 8,467,726 B2 | 6/2013 | Shirakata |
| 8,469,741 B2 | 6/2013 | Oster |
| 8,861,220 B2 | 10/2014 | Loher |
| 9,018,532 B2 | 4/2015 | Wesselmann et al. |
| 2002/0076948 A1 | 6/2002 | Farrell |
| 2002/0094701 A1 | 7/2002 | Bigelsen |
| 2003/0093248 A1 | 5/2003 | Vock |
| 2003/0098084 A1 | 5/2003 | Ragner et al. |
| 2003/0111126 A1 | 6/2003 | Moulton et al. |
| 2003/0127246 A1 | 7/2003 | Watanabe |
| 2003/0129905 A1 | 7/2003 | Dhawan et al. |
| 2004/0082189 A1 | 4/2004 | Totokawa |
| 2004/0111045 A1 | 6/2004 | Sullivan |
| 2004/0229533 A1 | 11/2004 | Braekevelt |
| 2004/0243204 A1 | 12/2004 | Maghribi |
| 2004/0259391 A1 | 12/2004 | Jung |
| 2005/0022338 A1 | 2/2005 | Muhlenkamp |
| 2005/0154264 A1 | 7/2005 | Lecompte et al. |
| 2005/0224993 A1 | 10/2005 | Manepalli et al. |
| 2005/0280157 A1 | 12/2005 | Roush |
| 2006/0000633 A1 | 1/2006 | Hopper |
| 2006/0035554 A1 | 2/2006 | Glaser |
| 2006/0046471 A1 | 3/2006 | Kirby |
| 2006/0128346 A1 | 6/2006 | Yasui |
| 2006/0254811 A1 | 11/2006 | Kirstein |
| 2006/0282018 A1 | 12/2006 | Balzano |
| 2007/0001844 A1 | 1/2007 | Krill |
| 2007/0054511 A1 | 3/2007 | Ittel |
| 2007/0125295 A1 | 6/2007 | Sanguinetti |
| 2007/0190881 A1 | 8/2007 | Shibaoka et al. |
| 2007/0232455 A1 | 10/2007 | Hanoun |
| 2007/0290305 A1 | 12/2007 | Oyama |
| 2008/0060873 A1 | 3/2008 | Lang |
| 2008/0157235 A1 | 7/2008 | Rogers |
| 2008/0182475 A1 | 7/2008 | Gnade |
| 2008/0223844 A1 | 9/2008 | Cronn |
| 2008/0241663 A1 * | 10/2008 | Yamashita ............ H01M 2/021 429/122 |
| 2008/0258314 A1 | 10/2008 | Yoo |
| 2008/0271220 A1 | 11/2008 | Chilton |
| 2009/0173529 A1 | 7/2009 | Lee |
| 2009/0273460 A1 | 11/2009 | Mancosu |
| 2009/0309739 A1 | 12/2009 | Ezer |
| 2009/0317639 A1 | 12/2009 | Axisa |
| 2010/0090834 A1 | 4/2010 | Buchnick |
| 2010/0325770 A1 | 10/2010 | Chung |
| 2011/0063098 A1 | 3/2011 | Fischer |
| 2011/0119812 A1 | 5/2011 | Genz |
| 2011/0130060 A1 | 6/2011 | Chung et al. |
| 2011/0175630 A1 | 7/2011 | Bhattacharya |
| 2011/0245633 A1 | 10/2011 | Goldberg |
| 2011/0262785 A1 * | 10/2011 | Johnson ............ H01M 2/1077 429/66 |
| 2012/0050036 A1 | 3/2012 | Landry |
| 2012/0176764 A1 | 7/2012 | Loher |
| 2012/0314382 A1 | 12/2012 | Wesselmann |
| 2013/0160183 A1 | 6/2013 | Reho |
| 2013/0161055 A1 | 6/2013 | Rule |
| 2013/0216065 A1 | 8/2013 | Nguyen |
| 2013/0256004 A1 | 10/2013 | Cotton |
| 2013/0316551 A1 | 11/2013 | Day, Jr. |
| 2014/0220422 A1 * | 8/2014 | Rogers ................ H05K 1/0283 429/163 |
| 2014/0275857 A1 | 9/2014 | Toth |
| 2014/0299362 A1 | 10/2014 | Park |
| 2014/0362020 A1 | 12/2014 | Rothkopf |
| 2015/0009129 A1 | 1/2015 | Song |
| 2015/0015288 A1 | 1/2015 | Ma |
| 2015/0068069 A1 * | 3/2015 | Tran ...................... H04B 1/385 36/136 |
| 2015/0091711 A1 | 4/2015 | Kosonen |
| 2015/0109124 A1 | 4/2015 | He |
| 2015/0185944 A1 | 7/2015 | Magi |
| 2015/0245777 A1 | 9/2015 | Della Torre |
| 2015/0312653 A1 | 10/2015 | Avrahami |
| 2016/0020500 A1 | 1/2016 | Matsuda |
| 2016/0034634 A9 | 2/2016 | Hong |
| 2016/0187122 A1 | 6/2016 | Krimon |

* cited by examiner

STRETCHABLE PRINTED BATTERY AND METHODS OF MAKING

CROSS-REFERENCE TO RELATED APPLICATION(S)

This application claims priority under 35 U.S.C. § 119(e) of the U.S. Provisional Patent Application Ser. No. 61/913,830, filed Dec. 9, 2013 and titled, METAL FABRIC STITCHING AND STRETCHABLE BATTERIES," which is also hereby incorporated by reference in its entirety for all purposes.

FIELD OF THE INVENTION

The present invention relates to the field of energy storage. More specifically, the present invention relates to stretchable batteries.

BACKGROUND OF THE INVENTION

Conventional battery and power storage are made to be confined in a non-deformable solid container, such as a rigid battery shell. The solid shell restrict the deformation of the structure, which restricts the uses of the conventional batteries.

FIG. 1 illustrates a conventional battery 100. The convention battery 100 comprises a cathode 102, an anode 106, and hard shell body 104. An amount of electrolyte 108 is contained in the shell body 104 and between the cathode 102 and the anode 106.

SUMMARY OF THE INVENTION

A method of and device for making a stretchable battery are disclosed. In some embodiments, the stretchable battery is formed by a printing process.

In an aspect, a battery comprises a stretchable body. In some embodiments, the stretchable body comprises a first current collector layer, a cathode layer, a solid electrolyte layer, an anode layer, and a second current collector layer. In other embodiments, the solid electrolyte layer covers an entire area of the cathode layer, such that the anode layer is prevented from direct contact with the cathode layer. In some other embodiments, the stretchable body couples with one or more conductive traces. In some embodiments, the stretchable body is patterned in a non-linear shape. In other embodiments, the non-linear shape comprises a re-occurring pattern. In some other embodiments, the body is stretchable in a plane. In some embodiments, the body is formed on an elastomer film.

In another aspect, a method of making a battery comprises printing an anode, a electrolyte, and a cathode on a substrate. In some embodiments, the substrate comprises an elastomer film. In other embodiments, the battery comprises a stretchable body. In some other embodiments, each of the anode, the electrolyte, and the cathode comprise a layered structure. In some embodiments, the method further comprises printing one or more current collectors. In other embodiments, the method further comprises coupling one or more conductive traces with the one or more current collectors. In some other embodiments, the printing is performed by using a printer. In some embodiments, the printing is performed by using a stencil/screen printer, an inkjet, an aerosol jet, a gravue, a flexography, or a combination thereof.

In another aspect, a method of making a battery comprises forming a first current collector layer on a substrate, forming an a first electrode layer on the first current collector layer, forming an electrolyte layer on the first electrode layer, forming a second electrode layer on the electrolyte layer, and forming a second current collector layer on the second electrode layer. In some embodiments, the first electrode layer comprises an anode and the second electrode layer comprises a cathode. In other embodiments, the first electrode layer comprises a cathode and the second electrode layer comprises an anode. In some other embodiments, the electrolyte layer covers an entire surface area of the first electrode layer. In some embodiments, the battery comprises a stretchable body.

Other features and advantages of the present invention will become apparent after reviewing the detailed description of the embodiments set forth below.

BRIEF DESCRIPTION OF THE DRAWINGS

Embodiments will now be described by way of examples, with reference to the accompanying drawings which are meant to be exemplary and not limiting. For all figures mentioned herein, like numbered elements refer to like elements throughout.

DETAILED DESCRIPTION OF THE PREFERRED EMBODIMENT

Reference is made in detail to the embodiments of the present invention, examples of which are illustrated in the accompanying drawings. While the invention is described in conjunction with the embodiments below, it is understood that they are not intended to limit the invention to these embodiments and examples. On the contrary, the invention is intended to cover alternatives, modifications and equivalents, which can be included within the spirit and scope of the invention as defined by the appended claims. Furthermore, in the following detailed description of the present invention, numerous specific details are set forth in order to more fully illustrate the present invention. However, it is apparent to one of ordinary skill in the prior art having the benefit of this disclosure that the present invention can be practiced without these specific details. In other instances, well-known methods and procedures, components and processes have not been described in detail so as not to unnecessarily obscure aspects of the present invention. It is, of course, appreciated that in the development of any such actual implementation, numerous implementation-specific decisions must be made in order to achieve the developer's specific goals, such as compliance with application and business related constraints, and that these specific goals vary from one implementation to another and from one developer to another. Moreover, it is appreciated that such a development effort can be complex and time-consuming, but is nevertheless a routine undertaking of engineering for those of ordinary skill in the art having the benefit of this disclosure.

Figure 1:
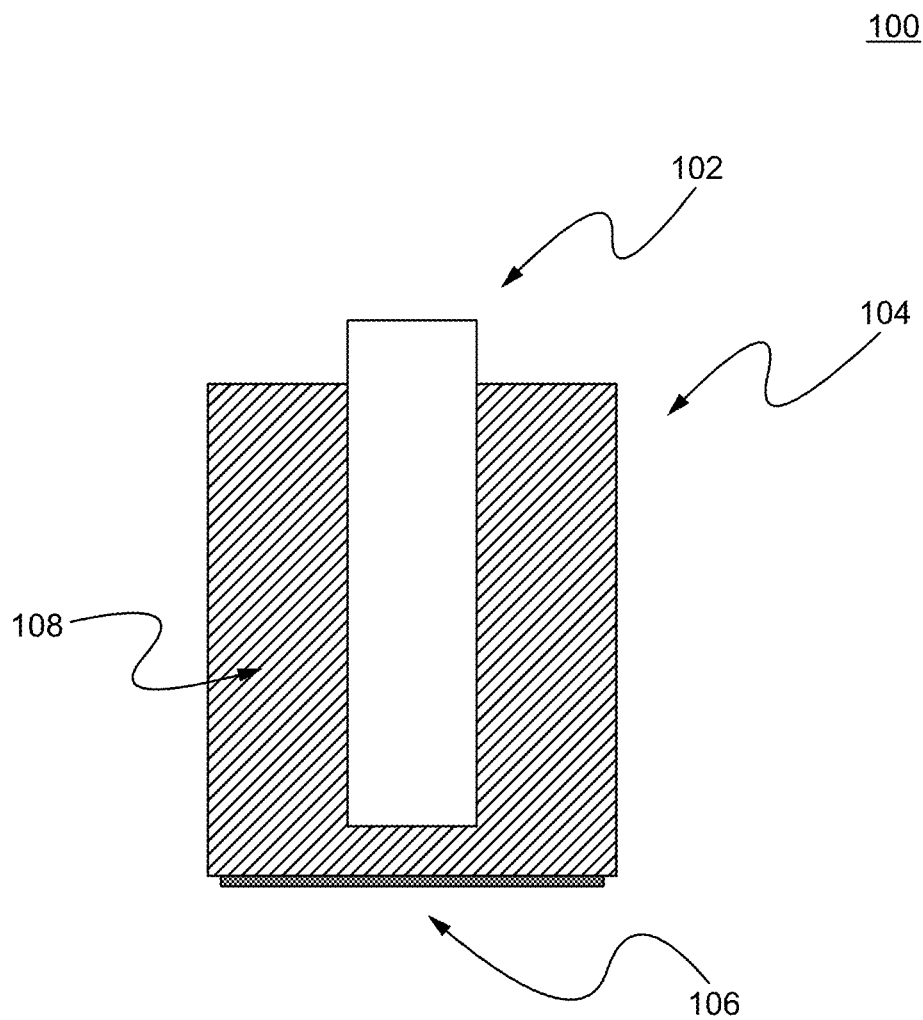
FIG. 1 illustrates a conventional battery.
Figure 2:
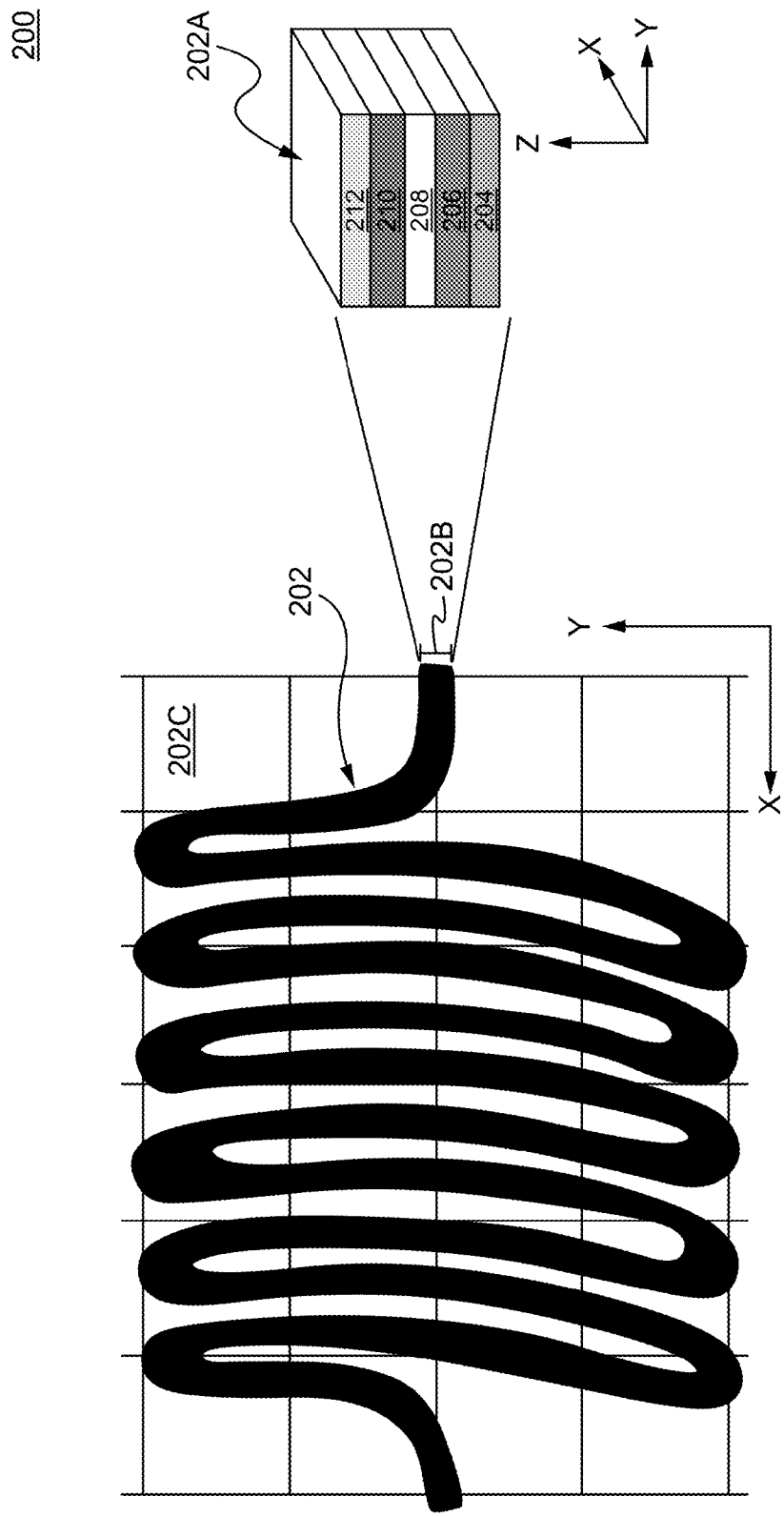
FIG. 2 illustrates a structure of a stretchable battery in accordance with some embodiments of the present invention.

FIG. 2 illustrates a structure of a stretchable battery 200 in accordance with some embodiments of the present invention. The stretchable battery 200 comprises a body 202. A cross sectional view of the body 202B shows that the body 202 comprises a layered structure 202A. The layered structure comprises a first current collector layer 204, a cathode layer 206, a solid electrolyte layer 208 (which is used as a separator), an anode layer 210, and a second current collector layer 212. In some embodiments, the solid electrolyte layer 208 is a zirconia-based material (e.g., yttria-stabilized zirconia) or beta-alumina solid electrolyte (such as solid electrolyte for fuel cells and paste of zinc ammonium chloride.)

In some embodiments, the layered structure 202A is enclosed/embedded in a stretchable elastomer substrate. A person of ordinary skill in the art appreciates that any other polymeric materials can be used to wrap the layered structure 202A, such as polyethylene, polypropylene, and silicone. In some embodiments, the layered structure 202A is embedded in a manner similar to metal traces in the electronic devices, such that the stretchable battery 200 can be integrated as part of the circuits of electronic devices.

In some embodiments, the current collector layers 204 and 212 are printed using a conductive ink, such as silver, copper, and/or nickel. In some embodiments, the conductive ink comprises ink and/or additive particles in micrometer and/or nanometer scales, such as from 3 micrometer to 1 nanometer. The particles can be all in an uniform size or mixed sizes. In some embodiments, the current collector layers 204 and 212 can have the same material as the material for making the typical metal interconnect for electronics. In some embodiments, the anode, the solid electrolyte, and the cathode materials are printed layer by layer on a stretchable substrate, such as an elastomer film 202C. In some embodiments, the elastomer films comprise urethane, silicone, polydimethylsiloxane (PDMS), or a combination thereof. A person of ordinary skill in the art will appreciate that any other polymers and elastomers are able to be used as the substrate so long the material has a stretchable or deformable property.

In some embodiments, the body 202 is patterned as a single line. In some other embodiments, the body 202 is patterned as multiple lines with a width and pitch of the stretchable wires in the range of 10 to 5 hundred microns. For example, the width of the body is able to be 25, 50, 100, and 150 microns. The pitch between the lines can be 25, 50, 100, and 150 microns. A person of ordinary skill in the art will appreciate that the width and pitch can be in any size ranges and combinations. In some embodiments, the ratio of the line coverage area to the open area (not printed area) is calculated to be balanced having optimized energy area density and battery stretchability.

The construction of the stretchable battery 200 provides an easy method of manufacturing a stretchable power source for electronics. In some embodiments, the method of making the stretchable battery 200 can be performed using a printer (such as a stencil, screen, inkjet, aerosol jet, gravue, and flexography). In some embodiments, the battery portion and/or the electronics can be molded with elastomers after the printing process.

Figure 3:
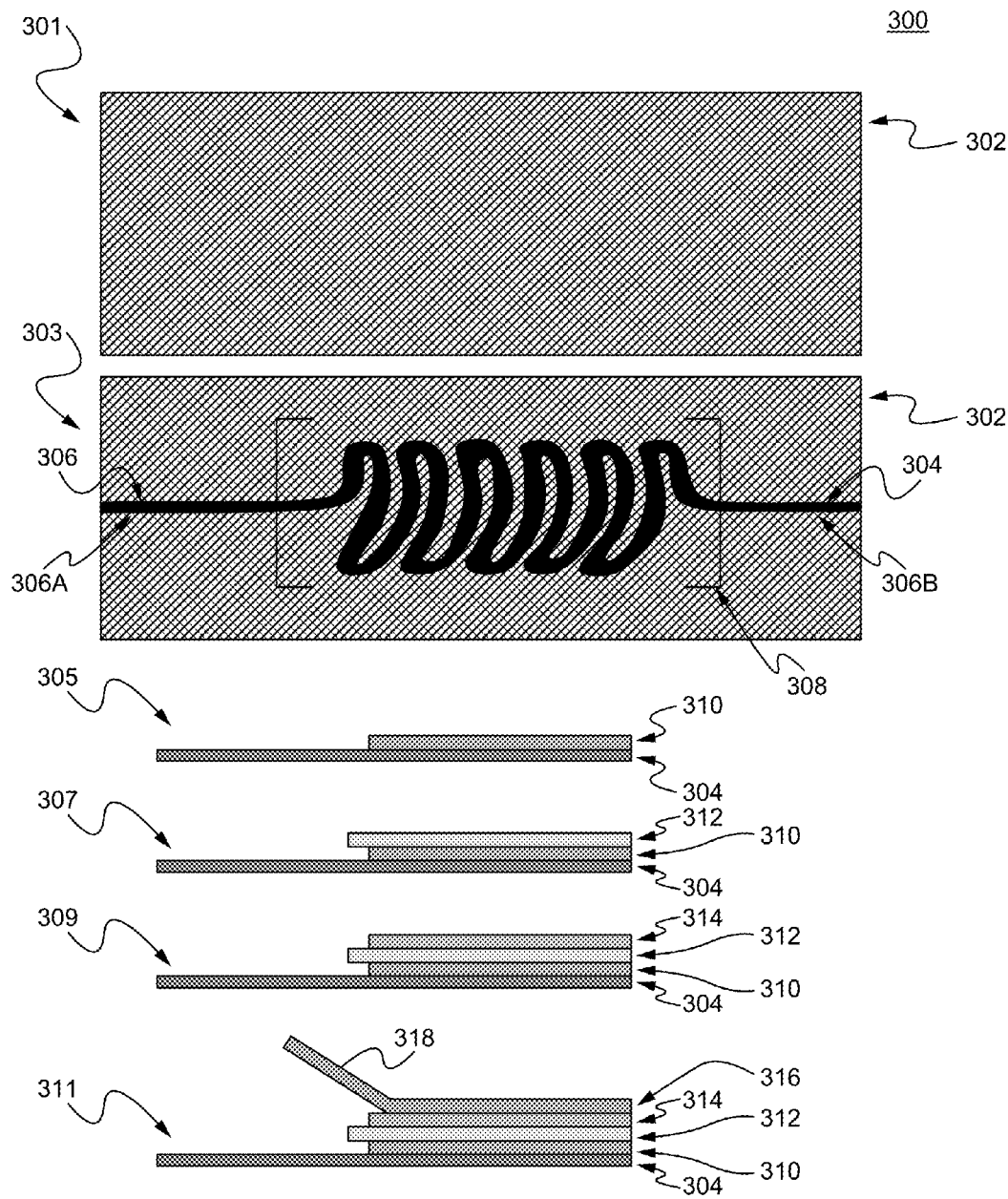
FIG. 3 illustrates a method of making a structure of a stretchable battery in accordance with some embodiments of the present invention.

FIG. 3 illustrates a method of making a structure of a stretchable battery 300 in accordance with some embodiments of the present invention. The two top images are plan views. The next four images are edge views showing the structure at various stages of manufacture. At Step 301, a film 302 is prepared. In some embodiments, the film 302 comprises an elastomer film. At Step 303, a first current collector 304 is printed on the film 302. A printer (such as a ink jet printer or aerosol printer) is used to print a predetermined pattern using a conductive ink forming the first current collector 304 for the battery on the film 302. In some embodiments, metal traces 306 are formed at the same time/concurrently while printing the first current collector 304. As shown, a first metal trace 306A couples with one end of an energy source portion 308 (such as to be printed as a battery). The other end of the energy source portion 308 couples with a second metal trace 306B. The Steps 301 and 303 are illustrated as a top view.

At Step 305, a cathode material is printed on top at the battery portion 308 of the current collector 304 forming a cathode 310. The cathode 310 overlaps and directly on top of the battery portion 308 of the first current collector 304. The Steps 305, 307, 309, and 311 are illustrated in a side view.

At Step 307, a solid electrolyte material is printed in the battery portion 308 on top of the cathode 310 forming a separator 312. In some embodiments, the separator 312 is wider than the cathode 310 fully covering the cathode 310 to prevent a shorting between the cathode 310 and an anode to be printed when formed. In some embodiments, the separator 312 covers the entire battery portion 308. In some other embodiment, the separator 312 covers the entire or substantial portion of the film 302.

At Step 309, an anode material is printed in the battery portion 308 directly on top of the separator 310 forming the anode 314.

At Step 311, a second current collector 316 is printed on top of the anode 314. In some embodiments, a second set of electronic circuit traces 318 are also printed to couple with the second current collector 316. The metal traces are coupled with circuitry of external/internal electronic components.

Figure 4:
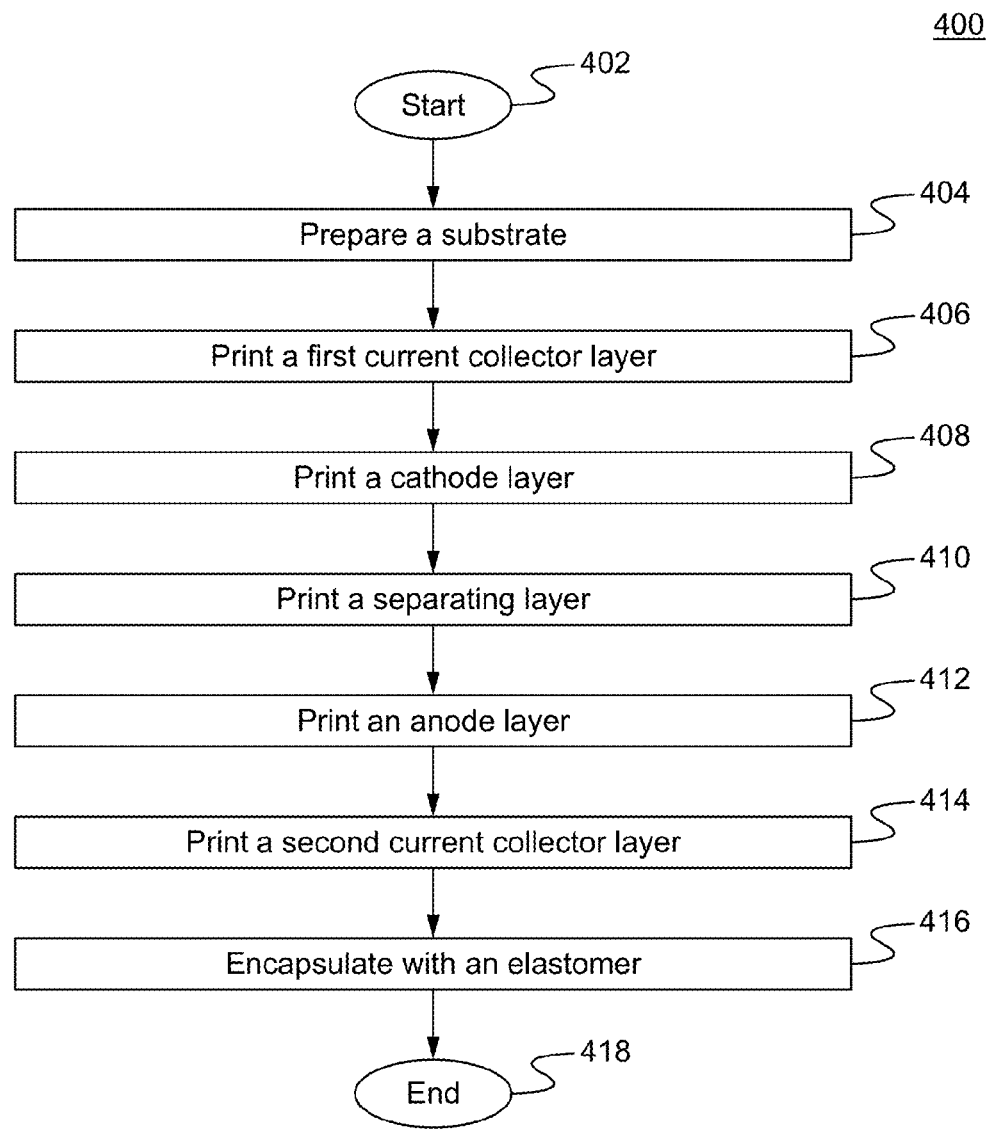
FIG. 4 is a flow chart illustrating a method of making a structure of a stretchable battery in accordance with some embodiments of the present invention.

FIG. 4 is a flow chart illustrating a method of making structure of a stretchable battery 400 in accordance with some embodiments of the present invention. The method 400 can start from Step 402. At Step 404, a substrate, a base layer, or a film layer is prepared. At Step 406, a first current collector is printed on the substrate. At Step 408, a cathode is formed by using a cathode material printed on top of the current collector. At Step 410, a separator is formed by printing a solid electrolyte material on top of the cathode. At Step 412, an anode is formed by using an anode material (such as zinc or graphite) printed on top of the separator. At Step 414, a second current collector is formed by printing on top of the anode. At Step 416, an elastomer is used to encapsulate the battery. In some embodiments, the battery is encapsulated by laminating a water proof elastomer sheet on the stack up battery. In some embodiments, an amount of heat can be applied locally or in one or more predetermined locations, such as the edges of the battery, to seal the top and/or bottom elastomer sheet. In some embodiments, a polymer is used to cover the entire area of the substrate. The method 400 can stop at Step 418. In some embodiments, the stretchable battery is water proof (hermetic). In some embodiments, one or more layers of metal sheets fully seal the battery.

Figure 5:
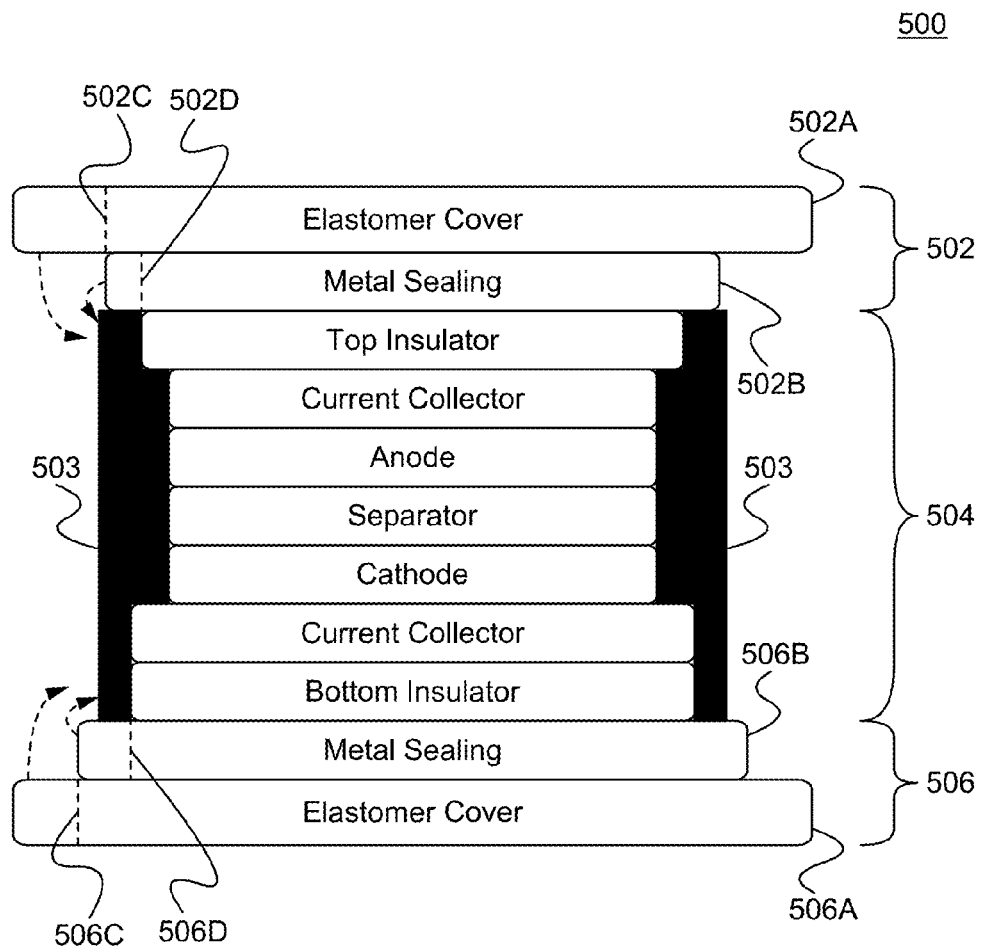
FIG. 5 illustrates a sealing structure of a stretchable battery in accordance with some embodiments of the present invention.

FIG. 5 illustrates a sealing structure of a stretchable battery 500 in accordance with some embodiments of the present invention. The stretchable battery 500 can comprise a top sealing portion 502, battery portion 504, and a bottom sealing portion 506. Each of the top sealing portion 502 and the bottom sealing portion 506 comprise a top elastomer sealing layer 502A and a bottom elastomer sealing layer 506A. In some embodiments, each of the top sealing portion 502 and the bottom sealing portion 506 comprise a top metal sealing layer 502B and a bottom metal sealing layer 506B. The elastomer sealing layers can enclose the metal sealing layers. In some embodiments, the top sealing portion 503 and the bottom sealing portion 506 can seal around the edges 502C and 506C of the cathode and anode. Localized heat or laser can be used to seal the metal layers. Heat and pressure can be used to seal the edges of the elastomers. In some embodiments, a non-conductive sealing material seals the sides 503 of the battery.

The sealing metal layer can be printed through a stencil or screen printing device using a nano based silver or copper ink. Once cured (by heat or UV), the nano metal materials are sintered to form a solid conductor without polymer inside to form a water barrier. During the printing process, the top sealing metal layer can be directly printed on the bottom sealing metal layer at the edge area of cathode and anode. A low power laser or localized heat is used to sinter the top and bottom metal together.

The stretchable battery has many advantageous aspects in industrial applications. For example, the stretchable battery serves as a stretchable power source. Metal interconnect are able to be made stretchable as high as several times, such as 700%. The stretchable battery can be made easily using typical printers or printing methods. Further, the printing process of the stretchable battery can be integrated with other printing processes for making other electronic parts, such that the two processes can be completed at the same time during an electronic device manufacturing process.

To utilize, the stretchable printed battery is able to be integrated like typical components of an electronic device, such as a watch.

In operation, the stretchable printed battery is pulled to extend and expand to a predetermined length or shape and couples with the circuitry of electronic devices.

The present invention has been described in terms of specific embodiments incorporating details to facilitate the understanding of principles of construction and operation of the invention. Such reference herein to specific embodiments and details thereof is not intended to limit the scope of the claims appended hereto. It is readily apparent to one skilled in the art that other various modifications can be made in the embodiment chosen for illustration without departing from the spirit and scope of the invention as defined by the claims.

What is claimed is:

1. A battery comprising a stretchable body, wherein the stretchable body includes:
    an energy source portion; and
    two sealing portions sandwiching the energy source portion, wherein each of the sealing portion includes an external elastomer cover and internal metal sealing layer that is lengthwise sized smaller than the external elastomer cover such that the internal metal sealing layer is enclosed within the stretchable body by ends of the external elastomer cover extending beyond ends of the internal metal sealing layer and sealing over the ends of the internal metal sealing layer.

2. The battery of claim 1, wherein the stretchable body comprises a first current collector layer, a cathode layer, a solid electrolyte layer, an anode layer, and a second current collector layer.

3. The battery of claim 2, wherein the solid electrolyte layer covers an entire area of the cathode layer, such that the solid electrolyte layer prevents the anode layer from contacting the cathode layer.

4. The battery of claim 1, wherein the stretchable body couples with one or more conductive traces.

5. The battery of claim 1, wherein the stretchable body is patterned in a non-linear shape.

6. The battery of claim 5, wherein the non-linear shape comprises a re-occurring pattern.

7. The battery of claim 1, wherein the stretchable body is stretchable in a plane.

8. The battery of claim 1, wherein the stretchable body is on an elastomer film.

9. A battery comprising a stretchable body, wherein the stretchable body includes:
    a structure that includes a first current collector layer, a cathode layer, a solid electrolyte layer, an anode layer, and a second current collector layer; and
    two sealing portions sandwiching the structure, wherein each sealing portion includes an external elastomer cover and an internal metal sealing layer that interfaces the structure, includes sintered nano-metal materials and is enclosed within the stretchable body by the external elastomer cover.

10. The battery of claim 9, wherein the second current collector layer is positioned on top of the anode layer, which is positioned on top of the solid electrolyte layer, which is positioned on top of the cathode layer, which is positioned on top of the first current collector layer.

11. The battery of claim 10, wherein the first and second current collector layers each includes conductive ink.

12. The battery of claim 11, wherein each layer in the structure is a printed layer on the bottommost external elastomer cover.

13. The battery of claim 12, wherein the solid electrolyte layer fully covers the cathode layer.

14. The battery of claim 13, wherein the two sealing portions encapsulate the structure.

15. The battery of claim 14, further comprising non-conductive sealing material covering the ends of the structure.

16. The battery of claim 15, further comprising a first set of electronic circuit traces coupling with the first current collector layer, wherein a first portion of the first set of electronic circuit traces couple with one end of the of the first current collector layer, and wherein a second portion of the first set of electronic circuit traces couple with another end of the of the first current collector layer that is opposite the one end of the of the first current collector layer.

17. The battery of claim 16, further comprising a second set of electronic circuit traces coupling with the second current collector layer, wherein a first portion of the second set of electronic circuit traces couple with one end of the of the second current collector layer, and wherein a second portion of the second set of electronic circuit traces couple with another end of the of the second current collector layer that is opposite the one end of the of the second current collector layer.

18. A battery comprising a stretchable body, wherein the stretchable body includes:
    a structure that includes a first current collector layer, a cathode layer, a solid electrolyte layer, an anode layer, and a second current collector layer; and
    two sealing portions sandwiching the structure, wherein each sealing portion includes an external elastomer cover and an internal metal sealing layer that interfaces the structure, wherein the metal sealing layer includes sintered nano-metal materials.

19. The battery of claim 18, wherein the second current collector layer is positioned on top of the anode layer, which is positioned on top of the solid electrolyte layer, which is positioned on top of the cathode layer, which is positioned on top of the first current collector layer.

20. The battery of claim 18, wherein the first and second current collector layers each includes conductive ink.

* * * * *